United States Patent
Limb et al.

(10) Patent No.: US 9,780,044 B2
(45) Date of Patent: Oct. 3, 2017

(54) TRANSIENT ELECTRONIC DEVICE WITH ION-EXCHANGED GLASS TREATED INTERPOSER

(71) Applicant: Palo Alto Research Center Incorporated, Palo Alto, CA (US)

(72) Inventors: Scott J. H. Limb, Palo Alto, CA (US); Gregory L. Whiting, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 264 days.

(21) Appl. No.: 14/694,132

(22) Filed: Apr. 23, 2015

(65) Prior Publication Data

US 2017/0084551 A1    Mar. 23, 2017

(51) Int. Cl.
*H01L 23/495*    (2006.01)
*H01L 23/00*    (2006.01)
(Continued)

(52) U.S. Cl.
CPC .......... *H01L 23/573* (2013.01); *H01L 21/486* (2013.01); *H01L 21/4853* (2013.01); *H01L 21/4864* (2013.01); *H01L 23/15* (2013.01); *H01L 23/49827* (2013.01); *H01L 23/49838* (2013.01); *H01L 23/49894* (2013.01);
(Continued)

(58) Field of Classification Search
CPC . H01L 23/573; H01L 23/15; H01L 23/49827; H01L 23/49838; H01L 23/49894; H01L 23/57; H01L 23/576; H01L 21/4853; H01L 21/486; H01L 21/4864; H01L 24/00; H01L 24/16; H01L 25/0655; H01L 2224/16157; H01L 2224/16235; H01L 2924/15311; H03K 19/17768
See application file for complete search history.

(56) References Cited

U.S. PATENT DOCUMENTS 4,102,664 A    7/1978    Dumbaugh, Jr.
4,598,274 A    7/1986    Holmes
(Continued)

FOREIGN PATENT DOCUMENTS

WO    0143228 A    6/2001

*Primary Examiner* — Calvin Choi
(74) *Attorney, Agent, or Firm* — Bever, Hoffman & Harms, LLP (57) ABSTRACT

A transient electronic device utilizes a glass-based interposer that is treated using ion-exchange processing to increase its fragility, and includes a trigger device operably mounted on a surface thereof. An integrated circuit (IC) die is then bonded to the interposer, and the interposer is mounted to a package structure where it serves, under normal operating conditions, to operably connect the IC die to the package I/O pins/balls. During a transient event (e.g., when unauthorized tampering is detected), a trigger signal is transmitted to the trigger device, causing the trigger device to generate an initial fracture force that is applied onto the glass-based interposer substrate. The interposer is configured such that the initial fracture force propagates through the glass-based interposer substrate with sufficient energy to both entirely powderize the interposer, and to transfer to the IC die, whereby the IC die also powderizes (i.e., visually disappears).

11 Claims, 7 Drawing Sheets

(51) Int. Cl.
    *H01L 23/15*     (2006.01)
    *H01L 25/065*     (2006.01)
    *H03K 19/177*     (2006.01)
    *H01L 23/498*     (2006.01)
    *H01L 21/48*     (2006.01)

(52) U.S. Cl.
    CPC ............ *H01L 23/57* (2013.01); *H01L 23/576* (2013.01); *H01L 24/00* (2013.01); *H01L 24/16* (2013.01); *H01L 25/0655* (2013.01); *H03K 19/17768* (2013.01); *H01L 2224/16157* (2013.01); *H01L 2224/16235* (2013.01); *H01L 2924/15311* (2013.01)

(56) References Cited

U.S. PATENT DOCUMENTS

| | | |
|---|---|---|
| 7,002,517 B2 | 2/2006 | Noujeim |
| 7,554,085 B2 | 6/2009 | Lee |
| 8,130,072 B2 | 3/2012 | De Bruyker et al. |
| 2013/0082383 A1* | 4/2013 | Aoya ................ H01L 23/49833 257/738 |
| 2013/0140649 A1 | 6/2013 | Rogers et al. |
| 2014/0266946 A1 | 9/2014 | Bily et al. |
| 2014/0300520 A1 | 10/2014 | Nguyen et al. |
| 2014/0323968 A1 | 10/2014 | Rogers et al. |
| 2015/0001733 A1* | 1/2015 | Karhade ................ H01L 23/538 257/774 |
| 2015/0076677 A1* | 3/2015 | Ebefors ............. H01L 23/49811 257/676 |
| 2015/0229028 A1 | 8/2015 | Bily et al. |
| 2015/0318618 A1 | 11/2015 | Chen et al. |
| 2015/0348940 A1* | 12/2015 | Woychik ............ H01L 25/0657 257/774 |
| 2015/0372389 A1 | 12/2015 | Chen et al. |

\* cited by examiner

TRANSIENT ELECTRONIC DEVICE WITH ION-EXCHANGED GLASS TREATED INTERPOSER

STATEMENT REGARDING FEDERALLY SPONSORED RESEARCH OR DEVELOPMENT

This invention is based upon work supported by DARPA under Contract No. HR0011-14-C-0013 (3765). Therefore, the Government has certain rights to this invention.

FIELD OF THE INVENTION

This invention relates to transient electronics, and in particular to interposers utilized in transient electronic assemblies.

BACKGROUND OF THE INVENTION

Large area sensing is critical for a variety of military, ecological and commercial interests and has historically been served through the use of centralized long-range sensors. However, rapid improvements in miniaturization of electronic systems have significantly improved the capabilities of small sensor devices. These micro-sensors have the potential to create "large N" distributed networks with advantages in operational adaptability, non-traditional sensing modalities that are only possible with close proximity, increased sensitivity and knowledge extraction through networked intelligence.

While distributed network systems have remarkable promise, their realistic use is limited by risks associated with their accumulation in the environment, detection and defeat, and exploitation due to inability to maintain positive control (unlike centralized long-range sensors).

The phrase "transient electronics" refers to a relatively new family of electronic devices that disappear (disaggregate and disperse) within a set period of time, making them ideally suited for distributed network systems. Conventional transient electronic systems typically rely on the use of soluble substrates and electronic materials (such as silk). When placed into solvent (typically water), these conventional substrates and electronics slowly dissolve into solution. As such, a distributed network system made up of conventional transient electronic devices can be expected to "disappear" over a relatively short amount of time (e.g., after periodic rainfall).

Although the conventional transient electronic approaches achieve the goal of causing the electronics to "disappear" after use, the long dissolution period required to achieve complete disaggregation and dispersal make the conventional approaches unfit for discrete (e.g., military) applications that require rapid and complete disaggregation upon command. Moreover, the conventional approaches utilize materials that are not compatible with existing integrated circuit fabrication and assembly techniques, requiring the development of new IC fabrication processes at significant cost.

Interposers are well-known electrical interfaces in the context of semiconductor device packaging, and are typically disposed between an IC die (chip) and a standardized semiconductor package structure, such as a ball-grid array (BGA) package or a pin-grid array (PGA) package. Interposers typically include a flat insulator substrate (e.g., either a rigid insulator such as FR4, or a flexible insulator such as polyimide) through which multiple metal conductors extend between corresponding contact structures (points) that are disposed in two different patterns on opposing substrate surfaces. That is, a first set of contact points disposed on one side of the interposer substrate are formed in a pattern that matches corresponding contact pads on the IC die to facilitate IC-to-interposer connection (e.g., by way of surface mounting techniques), and a second set of contact points on the opposing side of the interposer are arranged in a second (different) pattern that matches corresponding contact structures disposed on an inside surface of the host package to facilitate surface mounting of the interposer to the host package. The metal conductors pass through the interposer substrate to provide signal paths between corresponding contact structures of the first and second sets. With this arrangement, when the host package structure is subsequently connected, e.g., to the printed circuit board (PCB) of an electrical system, the interposer facilitates passing signals between the IC die(s) and the electrical system by way of the I/O pins/balls of the host package.

Interposers were originally typically utilized to reroute IC die connections to corresponding contact points on standard package structures, but more recently serve other purposes as well. For example, as advances in semiconductor fabrication facilitate smaller IC die having correspondingly finer pitched IC die contact pads, interposers are also utilized to spread the finely spaced IC die contact points to wider pitches that are more compatible with conventional package structures. In this case, the interposer includes first contact points arranged in a finely pitched (first) pattern on one surface, and second contact points arranged in a widely pitched (second) pattern on the opposing surface, with conductive metal vias and traces extending through the substrate and along the opposing surfaces to provide electrical signal paths between associated first and second contact points. In addition to spreading finely spaced IC die contact points to wider pitches, interposers are being used to secure two or more die into a single package structure.

What is needed is a transient electronic package assembly that is compatible with existing IC fabrication techniques, and achieves sufficiently complete, on-command disaggregation of IC die disposed thereon to provide both security and anti-tampering protection by way of preventing access to the intact integrated circuit implemented on the IC die.

SUMMARY OF THE INVENTION

The present invention is directed to a transient electronic device in which at least one integrated circuit (IC) die is mounted in a package structure by way of an intervening glass-based interposer, where the interposer includes a glass substrate that is treated to contain a sufficient amount of ions such that it fractures (powderizes) in response to a transient event triggering signal, and in doing so to also fractures (powderizes) the IC die(s) bonded thereon. Similar to conventional arrangements, the novel interposer includes a first set of contact points (i.e., metal pads or other contact structures) disposed on a first substrate surface and arranged in a (first) pattern that matches corresponding contact pads of the IC die, a second set of contact points disposed on the opposing substrate surface and arranged in a (second) pattern that matches corresponding contact structures of a package structure, and conductors extending on and/or through the substrate that form electrical signal paths between associated first and second contact points. According to an aspect of the invention, the IC die is fixedly attached to the interposer, and the interposer includes a glass substrate that is rendered fragile by way of ion-exchange treatment such that an initial fracture force generated by a trigger device in response to a trigger signal propagates through the interposer and powderizes the IC die. Specifically, the ion-exchange treated glass substrate is treated using known ion-exchange processes such that the glass is rendered with enough stored energy to generate secondary fractures in response to the initial fracture force such that the secondary fractures propagate throughout the glass substrate, whereby the glass substrate completely disaggregates ("powderizes") into micron-sized particulates (i.e., ≤100 µm across) using a mechanism similar to that captured in a Prince Rupert's Drop. By fixedly attaching the IC die to the glass substrate utilizing a suitable conventional bonding technique (e.g., anodic bonding or by way of sealing glass), the secondary fractures also propagate into the IC die with sufficient energy to powderize the IC die (i.e., substantially simultaneously with the powderization of the interposer substrate). The present invention thus facilitates the production of transient electronic devices and systems in which functional circuitry formed on the IC die(s) effectively disappears (powderizes) in a significantly shorter amount of time than is possible using conventional (e.g., soluble substrate) approaches. Moreover, by configuring the trigger device to initiate powderization upon detecting unauthorized tapering (e.g., tampering with the package structure or a printed circuit board to which the transient device is mounted), the present invention provides both security and anti-tampering protection by preventing unauthorized access to the integrated circuit implemented on the IC die while it is intact. Further, because the interposer is compatible with low-cost existing IC fabrication techniques, the present invention facilitates the production of transient electronic systems including electronic devices with minimal (or potentially without any) modification to core IC fabrication process.

According to an embodiment of the present invention, the interposer's glass substrate comprises a thin glass wafer/sheet (e.g., having a thickness in the range of 100 µm and 300 µm) of an ion-exchange specific glass (e.g., all silicate glasses having adequate alkali compositions) that is etched (e.g., using laser, mechanical or chemical etching techniques) to include multiple through-glass via (TGV) openings. The TGV openings are then filled with a conductive material (e.g., a metal such as copper), where the conductive material preferably has a Coefficient of Thermal Expansion (CTE) that is matched to (i.e., +/−10% of) the CTE of the ion-exchange specific glass, whereby the conductive material forms metal via structures having opposing ends that are exposed on the opposing substrate surfaces. Contact points (e.g., metal pads) and optional metal trace structures are then respectively patterned on one or both of the opposing substrate surfaces, the contact points being arranged in the desired patterns mentioned above, and the optional metal traces being patterned to provide electrical connections between corresponding pairs of upper/lower (first/second) contact points and opposing ends of associated metal via structures, thereby forming the interposer conductor (conductive path) between the corresponding pairs of upper/lower (first/second) contact points.

According to a presently preferred embodiment, a transient event trigger device is fabricated or otherwise disposed on each interposer when the interposer contact structures and metal trace structures are formed on the glass substrate. The trigger device includes an actuating mechanism that controls the release of (i.e., generates and applies) the initial fracture force in response to a trigger signal (e.g., an externally delivered current pulse) that is supplied to the trigger device. In alternative embodiments, the actuating mechanism comprises one of a device configured to apply resistive heating to the glass substrate, and a device configured to apply a mechanical pressure to the glass substrate. By configuring the trigger device in this way, upon receiving a trigger signal, the actuating mechanism is able to generate and apply a sufficiently strong initial fracture force to the glass substrate such that the interposer suddenly and catastrophically powderizes with sufficient force to assure complete destruction (powderization) of the IC die(s) mounted thereon.

According to another aspect of the invention, the IC die are fabricated and fixedly attached to the glass substrate using fabrication and die bonding techniques that assure coincident powderization of the IC die with the interposer. In a presently preferred embodiment, the IC die includes an IC device that is fabricated using standard silicon-on-insulator (SOI) fabrication techniques (i.e., such that the functional circuitry is implemented as an SOI integrated circuit structure). In one embodiment, the IC die is attached to the glass substrate using anodic bonding, which provides good interface adhesion for allowing crack propagation from the glass substrate to assure destruction of the adhered chip. In an alternative embodiment, another bonding method, such as using sealing glass, may be utilized. By forming the functional circuitry as SOI integrated circuits and anodically bonding the IC die to the glass substrate, reliable powderization of the IC die into small particulates during transient events is achieved. In another embodiment, the IC die is "thinned" (e.g., subjected to chemical mechanical polishing) either before or after the bonding process to reduce a thickness of the IC die, which further assures powderization of the IC die during a transient event.

According to another embodiment of the present invention, a method for producing transient electronic devices includes at least partially forming the interposer structure described above and subjecting the glass substrate to an ion-exchange treatment such that the frangibility of the glass substrate is increased. An optional shallow ion-exchange process is performed after the via etch to increase the frangibility along the via sidewalls. The trigger device (described above), the interposer contact structures and metal trace structures are formed/disposed on the glass substrate either before or after the ion-exchange treatment. One or more IC die are then fixedly attached (e.g., by anodic bonding) to an upper (first) surface of the treated glass substrate such that IC contact points are electrically connected to corresponding (first) interposer contact structures, and then the interposer is mounted onto a package structure such that contact structures disposed in a second pattern on the package structure are electrically connected to corresponding (second) interposer contact structures disposed on the lower (second) surface of the glass substrate. As described above, the interposer's glass substrate is subjected to ion-exchange treatment such that its ion content is increased until the treated glass substrate is sufficiently fragile to generate secondary fractures in response to the initial fracture force supplied by the trigger device, and the IC die is bonded to the treated glass substrate such that the secondary fractures propagate into the IC die with sufficient energy to powderize the IC die. The final particle size after triggering is based upon factors such as the glass substrate thickness, the level of ion-exchange processing, the die bonding process and the initial fracture force. In one embodiment, the IC die is patterned to provide fracture points (features) that assist in controlling the final fractured particle size (i.e., the fracture features are formed such that, when the glass substrate is powderized, the IC chip fractures along the patterned fracture features).

According to alternative specific embodiments the transient electronic device manufacturing method involves either sheet level interposer patterning or die level interposer patterning. In each case, multiple interposer cores are integrally disposed on a single glass sheet (i.e., the glass substrate of each interposer core is formed by a corresponding portion of the glass sheet). In the sheet level patterning approach, interposer contact structures and trigger devices are formed on each interposer core, then the glass sheet is diced to separate the individual interposers, which are then subjected to ion-exchange treatment (e.g., individually or in a batch), and then IC dies are then bonded onto each of the interposers. According to the die level patterning approach, the glass sheet is diced to separate the individual interposers and ion-exchange treatment is performed before interposer contact structures and trigger devices are formed on each interposer core, then IC dies are bonded onto each of the interposers. The main differences between these two approaches are cost and performance. Patterning the interposer layer before dicing will improve throughput and reduce cost but ion-exchanging the glass with patterned metal layers will also create a non-uniform surface stress profile which may reduce the frangibility. On the other hand, ion-exchanging individual die before patterning will provide a more reliable frangible substrate but the added cost of patterning individual pieces may not be favorable. Other variations to these exemplary approaches are evident to those skilled in the art.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in transient electronic devices. The following description is presented to enable one of ordinary skill in the art to make and use the invention as provided in the context of a particular application and its requirements. As used herein, directional terms such as "upper", "upward", "lower", "downward", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
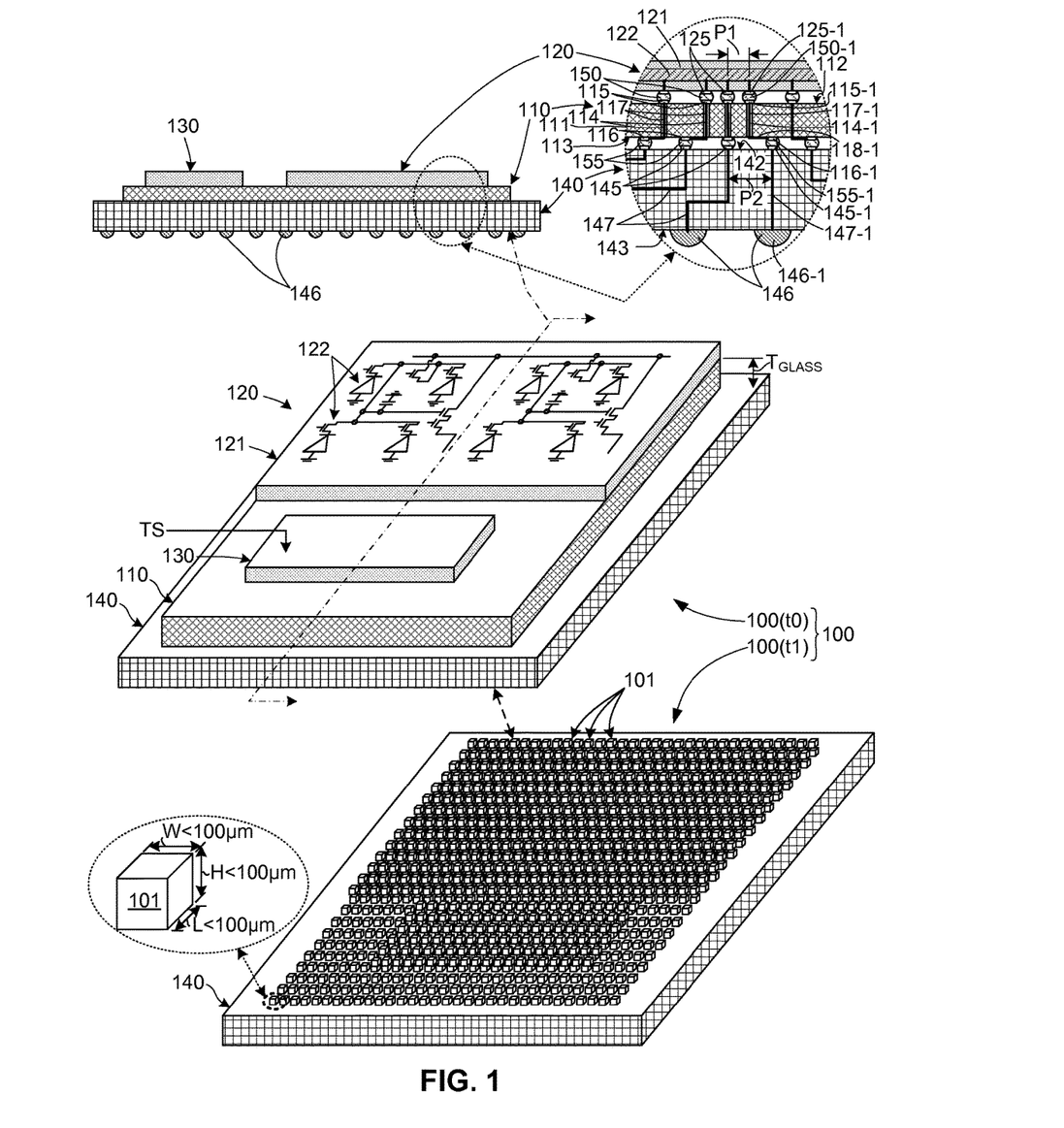
FIG. 1 is a top side perspective view showing a transient electronic device produced in accordance with an exemplary embodiment of the present invention.

FIG. 1 is a simplified diagram including perspective and cross-sectional views showing a transient electronic device 100 in a pre-transience "whole" state (i.e., device 100 (t0) shown in the middle and upper portions of FIG. 1) and a post-transience "powderized" state (i.e., device 100 (t1) shown in the lower portion of FIG. 1).

Referring to the middle and upper portions of FIG. 1, in the pre-transience state (e.g., immediately after production), transient electronic device 100 (t0) generally includes an integrated circuit (IC) die 120 and a trigger device 130 that are disposed on an interposer 110, with interposer 110 mounted onto an exemplary package structure 140.

Referring to the bubble located in the upper right portion of FIG. 1, IC die 120 is an integrated circuit device including an electronic circuit 122 formed on a substrate 121 (i.e., e.g., a semiconductor "chip") using any know semiconductor fabrication technique, although in a presently preferred embodiment, IC die 120 is silicon-on-insulator (SOI) integrated circuit device. Electronic circuit 122 includes one or more electronic elements that are configured to perform a prescribed useful function (e.g., sensor operations) up until a transient event, as described below. IC contact pads 125 are disposed in a first pattern P1 on a surface of the semiconductor substrate 121 and are operably coupled to electronic circuit 122, e.g., by way of conventional metallization patterns (not shown).

As depicted in the upper left portion of FIG. 1, package structure 140 is depicted in the exemplary embodiment as a ball-grid array (BGA) package structure including multiple balls or bumps 146 configured to facilitate surface-mount assembly onto a system circuit board (not shown). Specifically, as indicated the bubble located in the upper right portion of FIG. 1, package 140 includes multiple (first) package contact structures 145 disposed in a second pattern P2 on an upper surface 142 of a package substrate 141, with balls/bumps (second package contact structures) 146 disposed on and extending from a lower surface 143 of substrate 141. Package conductors 147 are formed using known techniques and extend through package structure 141 to provide signal paths between associated contact structures (e.g., conductor 147-1 forms an electrical path between package contact structure 145-1 and associated ball/bump 146-1). Of course, package structure 140 may be implemented using other package types, such as pin-grid array package structures.

Referring again to the upper left portion of FIG. 1, similar to conventional arrangements, interposer 110 is disposed between IC die 120 and package structure 140, and is secured to package substrate 140 such that it serves as an adapter that couples each contact pad 125 of IC die 120 to a corresponding ball/bump 146 on package structure 140. Specifically, interposer 110 includes a thin glass substrate 111 having an upper surface 112 and an opposing lower surface 113 separated by a substrate thickness $T_{GLASS}$ that, in a presently preferred embodiment, is in the range of 100 μm and 300 μm. A first set of contact points (i.e., metal pads or other contact structures) 115 are disposed in pattern P1 on upper surface 112 such that the position of each contact point 115 matches the location of a corresponding contact pad 125 of the IC die 120 to facilitate operable electrical connection (e.g., by way of solder structures 150) when IC die is surface mounted and fixedly attached (e.g., bonded) onto interposer 110. For example, as indicated in the bubble in FIG. 1, contact point 115-1 is aligned with corresponding contact pad 125-1, and is electrically connected by way of solder structure 150-1. Interposer 110 is secured to package substrate 140 by way of second contact points 116 disposed on lower surface 113, which are arranged in pattern P2 and respectively electrically connected (e.g., by way of solder structures 155) to corresponding package contact structures 145 on package structure 140 to facilitate operable electrical connection when interposer 110 is operably mounted onto package structure 140. For example, as indicated in the bubble in FIG. 1, contact point 116-1 is aligned with corresponding contact structure 145-1, and is electrically connected by way of solder structure 155-1. Interposer 110 further includes multiple conductors that form electrical signal paths between associated contact points 115 and 116, where each conductor includes a metal via structure 117 disposed in an associated through-glass via (TGV) opening 114 that extends through glass substrate 111, and one or more optional metal traces 118 that are formed on one or more of upper surface 112 and lower surface 113. For example, contact points 115-1 and 116-1 are connected by a conductor formed by metal via structure 117-1 and metal trace 118-1, which is formed on lower surface 113. Accordingly, interposer 110 provides an electrical signal path between contact pad 125-1 of IC die 120 and ball/bump 146-1 of package structure 140 by way of contact point 116-1, which is connected to ball/bump 146-1 by contact structure 145-1 and conductor 147-1, the conductor formed by metal via structure 117-1 and metal tract 118-1, and contact point 115-1.

As described in additional detail below, trigger device 130 functions to initiate powderization (fragmentation) of IC die 120 during a transient event by way of generating and applying an initial fracture force onto glass substrate 111 in response to an externally generated trigger signal TS. Specifically, trigger device 130 is configured to generate an initial fracture force in response to externally generated trigger signal TS, and is operably attached to upper surface 112 of glass substrate 111 such that the generated initial fracture force is applied onto glass substrate 111. As explained below, the initial facture force is generated with sufficient energy to cause powderization of interposer 110 and IC die 120.

According to an aspect of the invention, glass substrate 111 comprises an ion-exchange specific glass material (i.e., a glass that is receptive to ion exchange treatment), and interposer 110 is fabricated using processes that render glass substrate 111 sufficiently fragile such that, in response to the initial fracture force generated by trigger device 130, secondary fractures are generated and propagate through glass substrate 111 with sufficient energy to powderize glass substrate 111. Specifically, after an interposer core is generated in the manner described below, glass substrate 111 is subjected to treatment (tempering) using known ion-exchange processes such that the ionic content of glass substrate 111 (i.e., the amount of ions contained in glass substrate 111) is increased to a point that renders the glass sufficiently fragile such that, during a subsequent transient event, secondary fractures are generated in glass substrate 111 in response to the initial fracture force applied by trigger device 130. Further, as indicated by device 100 (t1) at the lower portion of FIG. 1, glass substrate 111 is rendered sufficiently fragile by the ion-exchange treatment such that the secondary fractures propagate throughout glass substrate 111 during a transient event, whereby the glass substrate 111 completely disaggregates ("powderizes") into micron-sized particulates (i.e., ≤100 μm across) using a mechanism similar to that captured in a Prince Rupert's Drop. That is, as indicated in the bubble located at the lower left portion of FIG. 1, the secondary fractures travel rapidly throughout treated glass substrate 111, whereby glass substrate 111 is suddenly and catastrophically disaggregated (powderized) into micron-sized particulates 101 (i.e., having length L, width W, and height H dimensions that are less than approximately 100 μm across). The optimal ion content of glass substrate 111 needed to achieve the above-described state of fragility (i.e., the parameters of the ion-exchange processing to which the interposer core is subjected) is dependent on several factors including the type and thickness of glass substrate 111, and determining the optimal amount is within the capabilities of those skilled in the art.

According to another aspect of the invention, IC die 120 is fixedly attached to interposer 110 such that the secondary fractures generated in glass substrate 111 during a transient event are transmitted with sufficient force to also powderize IC die 120. By fixedly attaching IC die 110 to glass substrate 111 utilizing a suitable conventional bonding technique (e.g., anodic bonding or by way of sealing glass), the secondary fractures generated in glass substrate 111 also propagate into IC die 120 with sufficient energy to powderize IC die 120 (i.e., substantially simultaneously with the powderization of interposer 110, as depicted at the bottom of FIG. 1). The present invention thus facilitates the production of transient electronic device 100 in which functional circuitry formed on IC die 120 effectively disappears (powderizes) in a significantly shorter amount of time than is possible using conventional (e.g., soluble substrate) approaches. Moreover, by configuring trigger device 130 to initiate powderization upon detecting unauthorized tapering (e.g., tampering with package structure 140 or a system circuit board, not shown, to which transient device 100 is mounted), the present invention provides both security and anti-tampering protection by preventing unauthorized access to electronic circuit 122 while IC die 120 is intact. Further, because interposer 110 is compatible with low-cost existing IC fabrication techniques, the present invention facilitates the production of transient electronic device 100 with minimal (or potentially without any) modification to the core IC fabrication processes.

Figure 2:
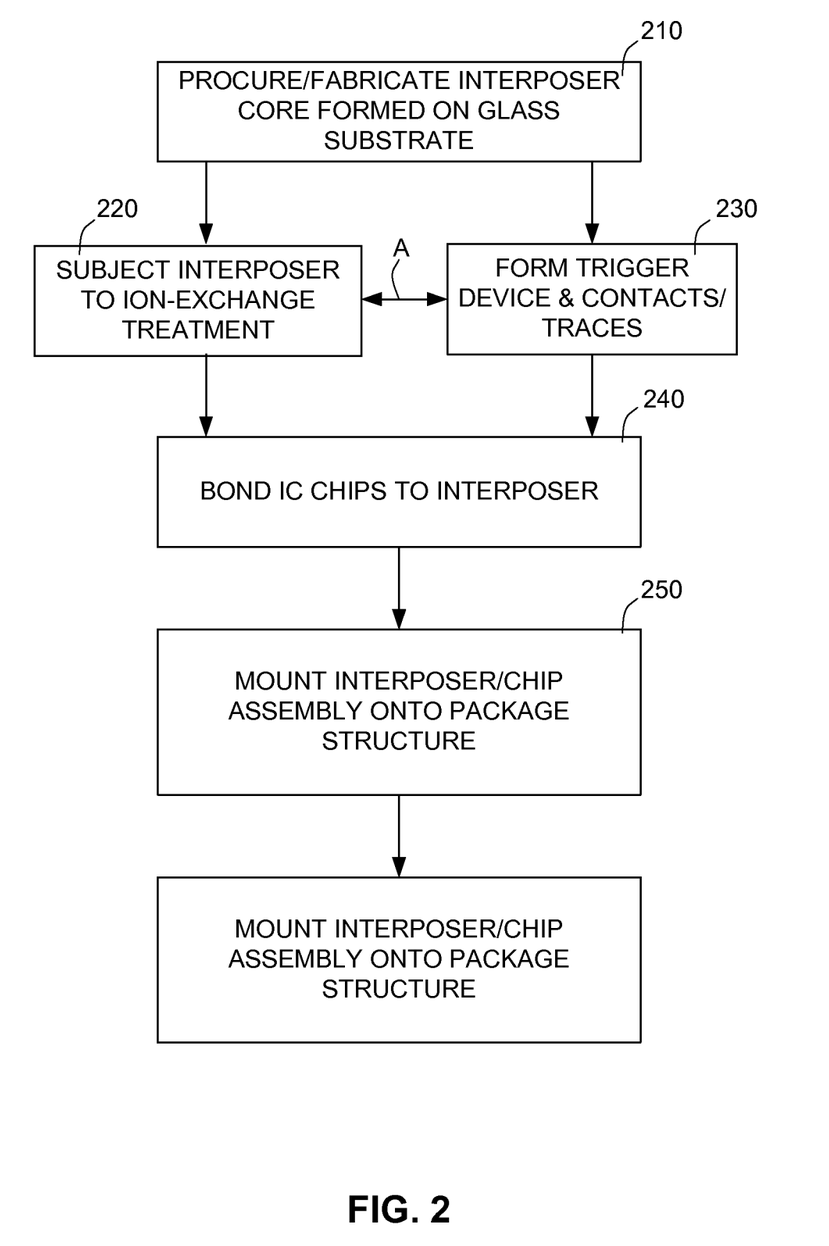
FIG. 2 is a flow diagram showing a generalized manufacturing process for producing the transient electronic device of FIG. 1.

FIG. 2 is a flow diagram showing a manufacturing process for producing transient electronic device 100 (see FIG. 1) according to an exemplary embodiment, where the method generally includes subjecting interposer 110 to ion-exchange treatment, then fixedly attaching IC die 120 to treated glass substrate 111, then securing interposer 110 to package 140. Referring to block 210 at the upper portion of FIG. 2, the method begins by procuring or fabricating an interposer core (e.g., a suitable glass substrate including metal via structures, but not including contact structures, metal traces or a trigger device). Fabrication of an exemplary interposer core is described below with reference to FIGS. 3 and 3(A) to 3(E). Next, ion-exchange treatment is performed to increase the ionic content of the glass substrate (block 220), and fabrication of the interposer is completed (i.e., contact structures are formed in accordance with predetermined arrangements, such as patterns P1 and P2 described above with reference to FIG. 1, metal traces are formed on one or both substrate surfaces, and a trigger device is formed or mounted on the glass substrate). As indicated by arrow A in FIG. 2 and as set forth in the specific exemplary embodiments described below, either the unfinished interposer core is subjected to ion-exchange treatment in block 220, or the interposer is finished in block 230 and then subjected to ion-exchange treatment in block 220. As indicated in block 240, after ion-exchange treatment is performed, one or more IC die(s) is/are bonded to each interposer in the manner described above using die-bonding techniques that promote the the propagation of secondary fractures from the interposer into the IC die(s) during transient events with sufficient energy to powderize the IC die(s). Referring to block 250, the interposer is then operably secured onto a package structure (e.g., BGA package structure 140, shown in FIG. 1), whereby the transient electronic device is ready for assembly into a host system.

Figures 3, 3A:
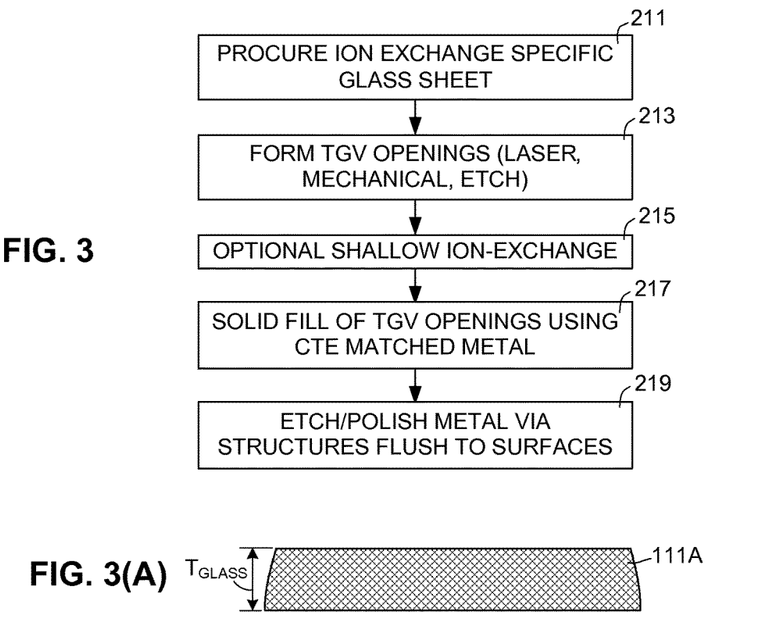
FIG. 3 is a flow diagram showing a manufacturing process for producing an interposer core including through-glass metal via structure according to an embodiment of the present invention.
FIGS. 3(A), 3(B), 3(C), 3(D) and 3(E) are simplified cross-sectional side views showing the production of an interposer core according to the process flow of FIG. 3.

FIG. 3 is a flow diagram showing a manufacturing process for producing an interposer core according to an embodiment of the present invention, and FIGS. 3(A) to 3(E) depict an exemplary interposer core during various stages of process flow of FIG. 3.

Referring to block 211 in FIG. 3 and to FIG. 3(A), the process begins by procuring an ion-exchange specific glass sheet 111A having a suitable thickness $T_{GLASS}$. Suitable ion-exchange specific glass includes unstrengthened Corning Gorilla Glass, SCHOTT Xensation and AGC Dragontrail glass, which are available from from various glass distributors such as Abrisa Technologies in Santa Paula, Calif.

Figure 3B:
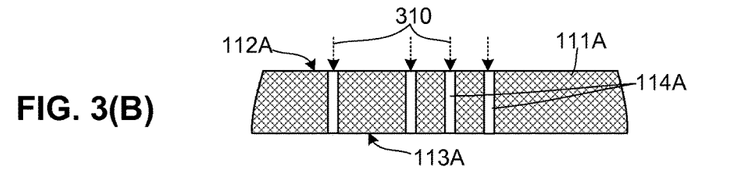

Referring to block 213 in FIG. 3 and to FIG. 3(B), through-glass via (TGV) openings 114A are formed that extend entirely through glass substrate 111A (i.e., between upper surface 112A and lower surface 113A). In alternative specific embodiments, TGV openings 114A are by etching or otherwise ablating portions of glass substrate 111A using one of a laser etching process, a mechanical etching process and a chemical etching process (which are collectively indicated by arrows 310 in FIG. 3(B)).

Figure 3C:
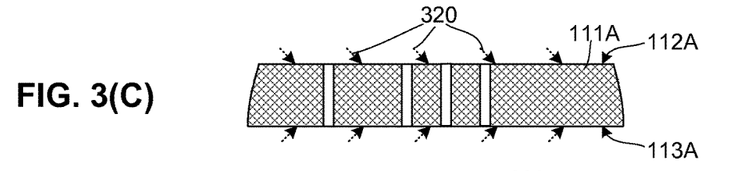
Figure 3D:
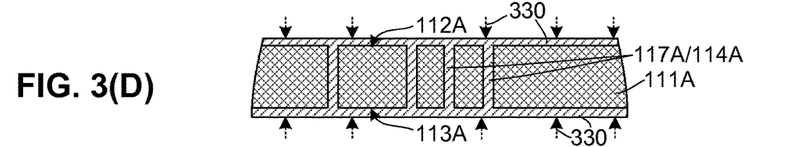

Referring to block 215 in FIG. 3 and to FIG. 3(C), an optional shallow ion-exchange process (indicated by arrows 320) is then performed (i.e., before forming metal via structures in TGV openings 114).

Figure 3E:
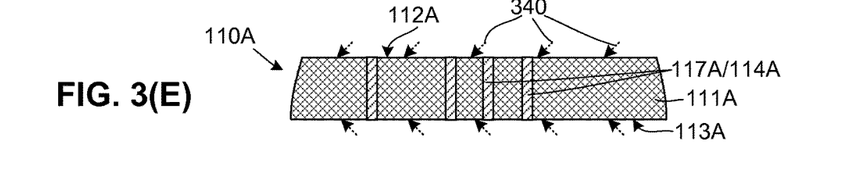

Metal via structure 117A are then formed in each TGV openings 114A using a suitable method. Referring to block 217 in FIG. 3 and to FIG. 3(D), in one specific embodiment a metal material 330 is deposited over upper surface 112A and lower surface 113A such that portions of the metal material enter each TGV opening 114A and forms corresponding metal via structures 117A. Referring to block 219 in FIG. 3 and to FIG. 3(E), residual portions of the metal material are then removed from upper surface 112A and lower surface 113A, e.g., using a suitable etchant 340. As depicted in FIG. 3(E), the etching process is performed such that resulting interposer core 110A includes each metal via structure 117A extends through glass substrate 111A and has opposing ends that are respectively exposed on upper surface 112A and lower surface 113A, which facilitates connection to subsequently formed structures (e.g., interposer contact structures and metal trace structures).

Figure 4A:
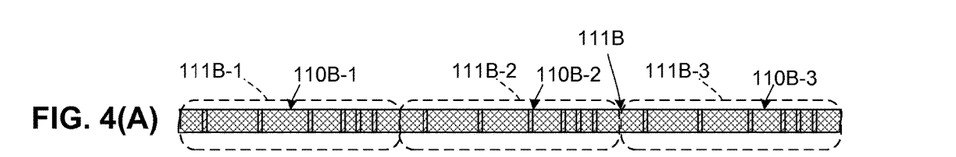
FIGS. 4(A), 4(B), 4(C), 4(D) and 4(E) are simplified cross-sectional side views showing the production of a multiple transient electronic devices according to a sheet level patterning embodiment of the present invention.

The interposer cores described above are then processed to provide completed interposers onto which IC dies are mounted. According to alternative exemplary embodiments, interposer cores are processed using either sheet level patterning or die level patterning. An exemplary sheet level patterning process is described below with reference to FIGS. 4(A) to 4(E), and an exemplary die level patterning process is described below with reference to FIGS. 5(A) to 5(E). Both sheet level and die level processing begin with multiple interposer cores that are formed and integrally connected together on a single glass sheet. For example, as shown in FIG. 4(A), a single (continuous/unbroken) glass sheet 111B includes three integrally connected interposer cores 110B-1, 110B-2 and 110B-3, each having a respective glass substrate 111B-1 111B-2 and 111B-3 formed by a corresponding portion of glass sheet 111B. Similarly, as shown in FIG. 5(A), integral interposer coress 110C-1, 110C-2 and 110C-3 have respective glass substrates 111C-1 111C-2 and 111C-3 formed by corresponding portions of a single glass sheet 111C.

Figure 4B:
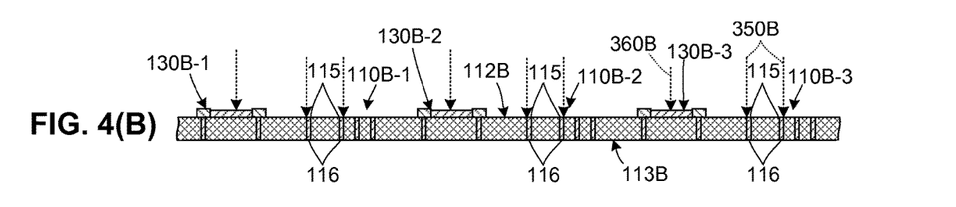
Figure 4C:
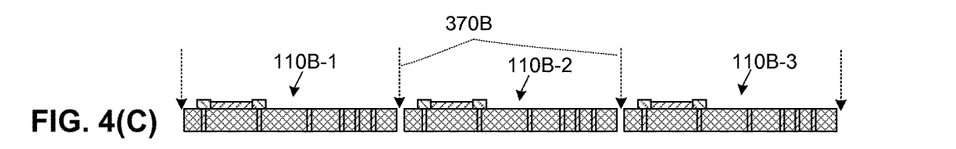
Figure 4D:
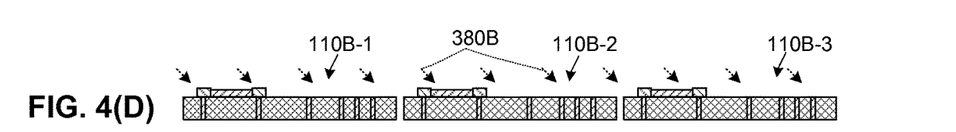
Figure 4E:
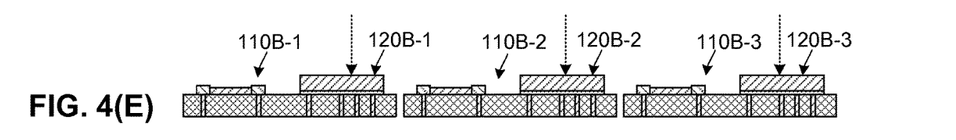
Figure 5A:
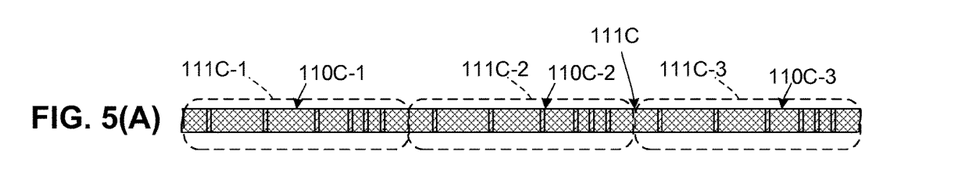
FIGS. 5(A), 5(B), 5(C), 5(D) and 5(E) are simplified cross-sectional side views showing the production of a multiple transient electronic devices according to a die level patterning embodiment of the present invention.
Figure 5B:
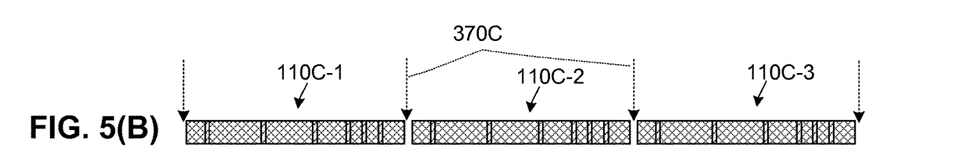

Starting with the integral interposer cores shown in FIG. 4(A), sheet level patterning begins as shown in FIG. 4(B) by patterning contact structures, optional metal trace structures, and trigger devices onto each interposer core using known techniques. For example, contact structures 115 (and optional metal trace structures, not shown) are formed of glass sheet 111B by way of printing a suitable metal 350B onto upper sheet surface 112B. Contact structures 116 and optional metal trace structures (not shown) are formed on lower sheet surface 113B are then formed, for example, by inverting sheet 111B and repeating the metal printing process. Trigger devices 130B-1 to 130B-3 are then formed by depositing a suitable material 360B using a printing process, or by surface mounting a pre-formed structure onto each interposer 110B-1 to 110B-3, respectively. Referring to FIG. 4(C), glass sheet 111B is then diced (e.g., cut using a laser 370B) to separate interposers 110B-1 to 110B-3 from each other, and then the individual interposers 110B-1 to 110B-3 are subjected to ion-exchange treatment (indicated by arrows 380B) as shown in FIG. 4(D). As indicated in FIG. 4(E), after ion-exchange treatment, IC dies 120B-1, 120B-2 and 120B-3 are then bonded onto interposers 110B-1, 110B-2 and 110B-3, respectively.

Figure 5C:
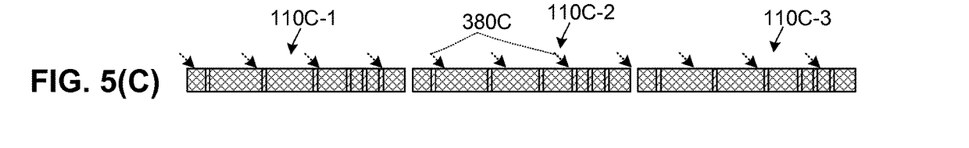
Figure 5D:
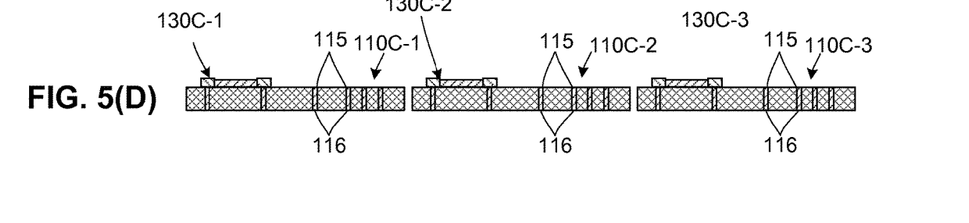
Figure 5E:
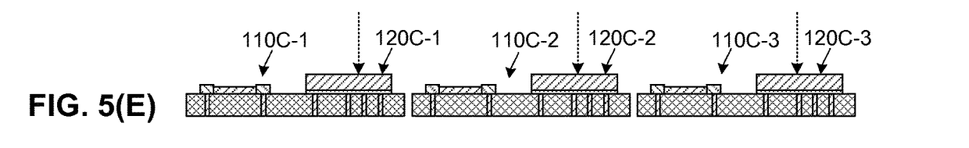

Die level patterning, which is depicted in FIGS. 5(A) to 5(E), involves processing each interposer core separately. That is, starting with the integral interposer cores shown in FIG. 5(A), die level patterning begins with dicing (e.g., cutting using a laser 370C) to separate interposer cores 110C-1 to 110C-3 from each other, then the individual interposer cores 110C-1 to 110C-3 are subjected to ion-exchange treatment (indicated by arrows 380C), as shown in FIG. 5(C). After ion-exchange treatment, as shown in FIG. 5(D), contact structures 115 and 116, optional metal trace structures, and trigger devices 130C-1 to 130C-3 are formed on each interposer core 110C-1 to 110C-3 using the techniques mentioned above, and then, as indicated in FIG. 5(E), IC dies 120C-1, 120C-2 and 120C-3 are then bonded onto interposers 110C-1, 110C-2 and 110C-3, respectively.

FIGS. 6(A) to 6(F) depict the fabrication and subsequent actuation of a transient electronic device 100D according to another embodiment of the present invention.

Figure 6A:
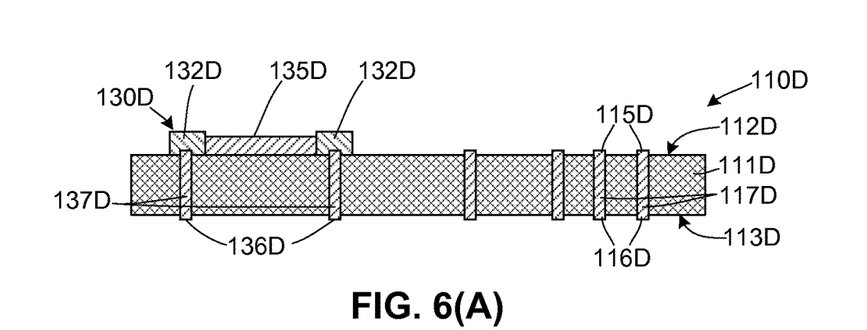
FIGS. 6(A), 6(B), 6(C), 6(D), 6(E) and 6(F) are cross-sectional side views showing a transient electronic device produced in accordance with another embodiment of the present invention.

FIG. 6(A) depicts an interposer 110D produced in a manner consistent with the methodologies mentioned above. For descriptive purposes, associated contact structures 115D and 116D, which are respectively disposed on upper surface 112D and lower surface 113D, are connected by way of simple contact structures comprising an associated metal via structure 117D. In the present embodiment, trigger device 130D is electrically controlled, and more specifically utilizes a heating element to generate local heating in response to an applied electrical pulse transmitted through metal via structures 137D, which are connected to associated contact structures 136D disposed on lower surface 113D. In one embodiment, trigger device 130D is constructed by forming a wide/thicker lower resistance electrodes 132D onto associated upper end portions of metal via structures 137D, and then forming a resistive, thin, narrow resistor (actuator) structure 135D between electrodes 132D, where resistor structure 135D is formed using a material that is capable of sustaining high temperature (e.g., a metal such as tungsten). Trigger device 130D is fabricated directly onto glass substrate 110D using standard microfacrication techniques (vapor deposition and photo-patterning) or simply through shadow-masked evaporation.

Figure 6B:
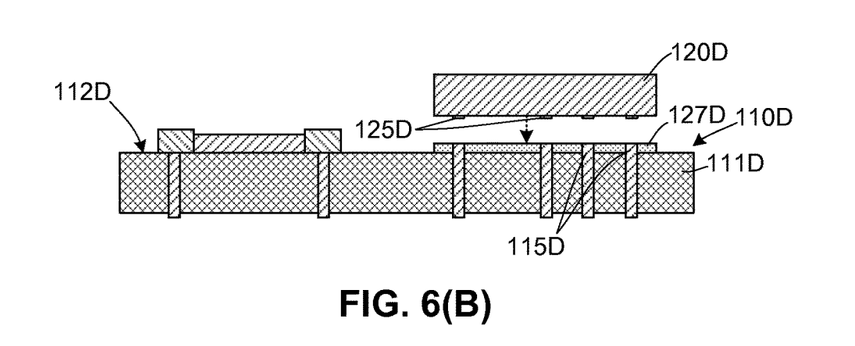

FIG. 6(B) depicts the subsequent fixed attachment of IC die 120D to glass substrate 111D by way of either sealing glass 127D or an anodic bond. As described above with reference to FIG. 1, IC die 120D is mounted such that contact pads 125D make electrical contact with contact structures 115D disposed on upper surface 112D of glass substrate 111D.

Figure 6C:
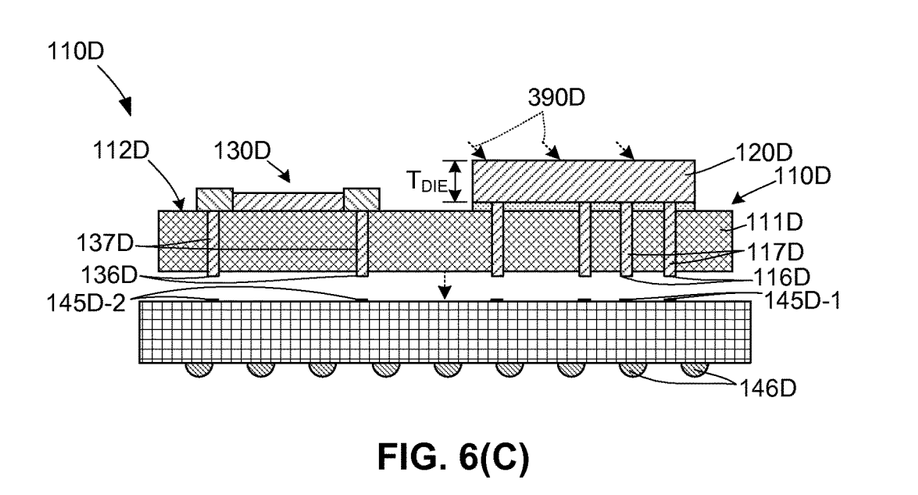

FIG. 6(C) depicts securing interposer 110D to a package structure 140D in order to complete the assembly of transient electronic device 110D. As set forth above, interposer 110D is mounted such that package contact structures 145D-1 are electrically connected to corresponding interposer contact structures 116D, which are disposed on lower surface 113D of glass substrate 111D. In this embodiment, the actuation of trigger device 130D is also enabled by way of electrical connection between package contact structures 145D-2 and corresponding contact structures 136D, which forms a signal path between balls/bumps 146D of package structure 140D and trigger device 130D by way of conductors (not shown) formed in package structure 140 and metal via structures 137D disposed in interposer 110D.

As also depicted in FIG. 6(C), in one embodiment IC die 120D is thinned via chemical mechanical polishing (CMP) 390D to a realistic thickness $T_{DIE}$ in order to further promote powderization. The key to achieving fragmentation of IC die 120D is coupling the propagating fracture cracks from glass substrate 111D into IC die 120D, which is further enabled by thinning IC die 120D (i.e., either after attachment to interposer 110D, as depicted, or before attachment). The fragmentation process can be viewed as a competition between two possible outcomes: a crack can propagate upward into the die substrate/silicon, or make a sharp turn and instead propagate through the bond region, leading to de-bonding. To exceed the ratio needed for a glass/silicon bond, either an anodic bond or a low-melting-point sealing glass 127D is utilized to secure IC die 120D to glass substrate 111D. Alternatively, eutectic or adhesive bonding may be used to secure IC die 120D to glass substrate 110D.

Figure 6D:
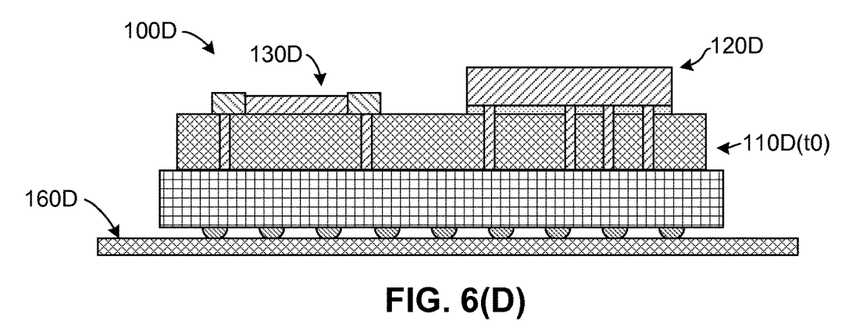

FIG. 6(D) depicts the subsequent attachment of transient electronic device 100D to a system level printed circuit board 160D, which supplies power to and communicates with IC 120D by way of package structure 140D and interposer 110D. In the exemplary embodiment, circuit board 160D is mounted inside a secured housing (not shown) that includes a security system (e.g., sensors) capable of detecting unauthorized tampering with the housing, and a control system configured to communicate with IC die 120D and trigger device 130D. That is, under normal operating conditions, the system controller facilitates functional operation of IC die. However, as described below with reference to FIGS. 6(E) and 6(F), when the system controller detects unauthorized tampering with the system housing (which may be related to an attempt to access or tamper with the functional circuitry of IC die 120D), the system controller transmits trigger signals to trigger device 130D in order to initiate a transient event.

Figure 6E:
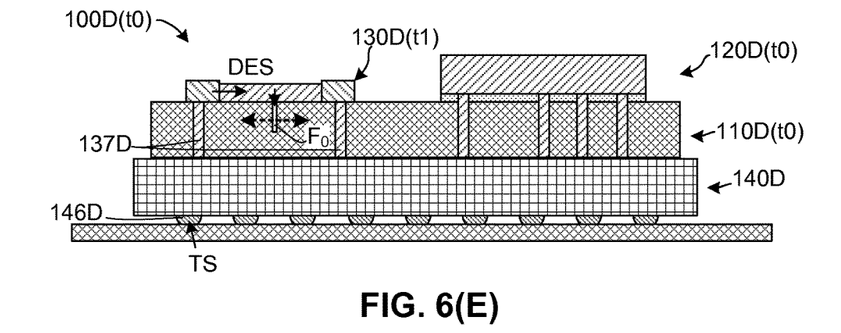
Figure 6F:
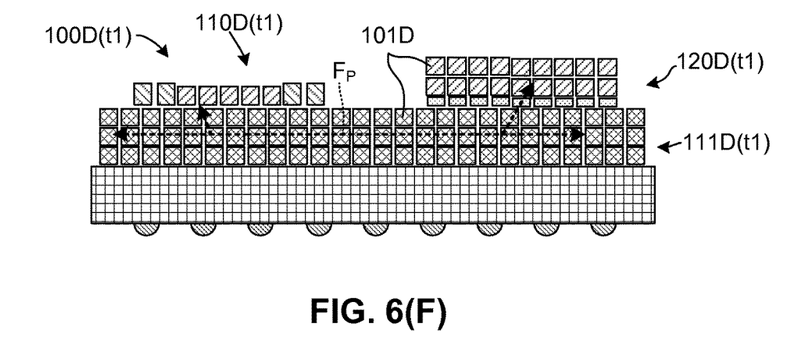

FIGS. 6(E) and 6(F) illustrate the controlled destruction (disaggregation) of transient electronic device 100D during a transient event (i.e. in response to a trigger signal TS applied to transient electronic device 100D by way of balls/bumps 146D of package structure 140D). In the exemplary embodiment, the mechanism of fracture generated by trigger device 130D is hoop stress generated as the portion of glass substrate 110D heated by resistor structure 135D expands. Simulation of such trigger devices indicate that 0.5 ms after the current pulse is applied, tensile hoop stresses in the range of 100-150 MPa are present below the resistor structure—this would be sufficient to initiate fracture in almost any traditionally tempered glass. These simulation results show that large surface tensile stresses can be obtained with a modest amount of current and energy. In this example, based on resistance estimates using properties for tungsten, the current is approximately 70 mA, and the voltage developed across the resistor is about 80 mV. These amounts are well within the capabilities of currently available small-form-factor batteries. As indicated in FIG. 6(E), at time t0 (i.e., immediately after transmission of trigger signal TS), a resulting initial fracture $F_0$ is generated in glass substrate 110D by way of localized heating, but IC die 120D remains entirely intact. As indicated in FIG. 6(F), secondary fractures $F_P$ are generated in glass substrate 111D (t1) in response to the initial fracture force that propagate throughout glass substrate 111D (t1), whereby said glass substrate 111D (t1) is powderized into particulates 101D. In addition, because IC die 120D (t1) is sufficiently bonded to glass substrate 111D (t1), secondary fractures $F_P$ propagate into IC die 120D (t1) with sufficient energy to powderize the die material into particulates 101D.

In addition to the localized heating approach described in the previous embodiment, other trigger devices may be utilized to generate the initial fracture required to generate powderization of the device. For example, suitable trigger devices may be produced that generate localized fracturing using by initiating a chemical reaction on the surface of the glass substrate, or by applying a localized mechanical pressure (e.g., using a piezoelectric element) on the glass substrate.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A transient electronic device comprising:
   an integrated circuit (IC) die including a semiconductor substrate having an electronic circuit formed thereon, and IC contact pads disposed in a first pattern on a surface of the semiconductor substrate, said IC contact pads being operably coupled to said electronic circuit;
   a package structure including a package substrate, a plurality of first package contact structures disposed in a second pattern on a first surface thereof, a plurality of second package contact structures disposed on a second surface thereof, and a plurality of package conductors extending through the package structure between the first and second surfaces such that each said package conductor forms an electrical path between an associated first package contact structure and an associated second package contact structure;

an interposer comprising a glass substrate including a plurality of first contact points disposed in the first pattern on a first surface thereof, a plurality of second contact points disposed on a second surface thereof, and a plurality of interposer conductors, each said interposer conductor being configured to form an electrical path between an associated first contact point and an associated second contact point; and a trigger device attached to the interposer and configured to generate and apply an initial fracture force on said glass substrate in response to a trigger signal, wherein the interposer is secured to the package substrate such that each of the second contact points disposed on the second surface are electrically connected to corresponding first package contact structures, wherein the glass substrate contains an amount of ions such that secondary fractures are generated in said glass substrate in response to said initial fracture force and propagate throughout said glass substrate, whereby said glass substrate is powderized, and wherein the IC die is fixedly attached to the glass substrate such that the secondary fractures propagate into said IC die with sufficient energy to powderize said IC die.

2. The transient electronic device of claim 1, wherein the glass substrate comprises a thickness in the range of 100 μm and 300 μm.

3. The transient electronic device of claim 2, wherein the glass substrate comprises a silicate glass.

4. The transient electronic device of claim 2, wherein said glass substrate defines a plurality of through-glass vias extending between the first surface and the second surface thereof.

5. The transient electronic device of claim 4, wherein each said interposer conductor comprises a metal via structure extending through an associated said through-glass via.

6. The transient electronic device of claim 5, wherein said metal via structure comprises a conductive material having a Coefficient of Thermal Expansion (CTE) that is matched to a CTE of the glass substrate.

7. The transient electronic device of claim 4, wherein at least some of said interposer conductors further comprises a metal trace structure disposed one one of said first surface and said second surface and extending from an associated said metal via structure to one of an associated said first contact point and an associated said second contact point.

8. The transient electronic device of claim 1, wherein said trigger device comprises an actuating mechanism configured to control release of said initial fracture force in response to an externally supplied trigger signal.

9. The transient electronic device of claim 8, wherein said actuating mechanism comprises one of a device configured to apply resistive heating to said glass substrate and a device configured to apply a mechanical pressure to said glass substrate.

10. The transient electronic device of claim 1, wherein said IC die is anodically bonded to said glass substrate.

11. The transient electronic device of claim 1, wherein said IC die comprises a silicon-on-insulator (SOI) integrated circuit device.

* * * * *